United States Patent
Bono et al.

(10) Patent No.: US 10,361,247 B2
(45) Date of Patent: Jul. 23, 2019

(54) DEVICE COMPRISING A PLURALITY OF DIODES

(71) Applicant: Commissariat à l'Énergie Atomique et aux Énergies Alternatives, Paris (FR)

(72) Inventors: Hubert Bono, Grenoble (FR); Jonathan Garcia, Clelles-en-Trieves (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 0 days.

(21) Appl. No.: 15/897,119

(22) Filed: Feb. 14, 2018

(65) Prior Publication Data
US 2018/0233535 A1    Aug. 16, 2018

(30) Foreign Application Priority Data
Feb. 15, 2017   (FR) .................................. 17/51239

(51) Int. Cl.
| H01L 27/08 | (2006.01) |
| H01L 27/15 | (2006.01) |
| H01L 27/24 | (2006.01) |
| H01L 33/08 | (2010.01) |
| H01L 33/20 | (2010.01) |

(Continued)

(52) U.S. Cl.
CPC ........ *H01L 27/153* (2013.01); *H01L 27/0814* (2013.01); *H01L 27/1021* (2013.01); *H01L 27/156* (2013.01); *H01L 27/2409* (2013.01); *H01L 29/861* (2013.01); *H01L 29/8611* (2013.01); *H01L 33/20* (2013.01); *H01L 33/32* (2013.01); *H01L 33/385* (2013.01); *H01L 33/62* (2013.01); *H01L 33/08* (2013.01); *H01L 33/382* (2013.01); *H01L 2924/12036* (2013.01); *H01L 2924/12041* (2013.01)

(58) Field of Classification Search
CPC ........ H01L 2924/12036; H01L 29/861; H01L 2924/12041; H01L 29/8611; H01L 27/2409; H01L 27/1021; H01L 27/0814; H01L 27/153; H01L 33/20; H01L 33/385; H01L 33/382
See application file for complete search history.

(56) References Cited

U.S. PATENT DOCUMENTS 6,762,440 B1 *   7/2004  Pairitsch ............. H01L 27/0255
                                                                257/173
7,221,044 B2 *   5/2007  Fan ....................... H01L 27/153
                                                                257/676

(Continued)

FOREIGN PATENT DOCUMENTS

| CN | 102 479 914 A | 5/2012 |
| CN | 105 161 587 A | 12/2015 |

(Continued)

OTHER PUBLICATIONS

International Search Report for Application No. FR 1751239 dated Jul. 13, 2017.
1751239, Jul. 13, 2017, International Search Report.

*Primary Examiner* — Ngan V Ngo
(74) *Attorney, Agent, or Firm* — Wolf, Greenfield & Sacks, P.C.

(57) ABSTRACT

A device including a plurality of interconnected concentric coplanar diodes.

6 Claims, 9 Drawing Sheets

(51) Int. Cl.
- *H01L 33/32* (2010.01)
- *H01L 33/38* (2010.01)
- *H01L 33/62* (2010.01)
- *H01L 27/102* (2006.01)
- *H01L 29/861* (2006.01)

(56) References Cited

U.S. PATENT DOCUMENTS

| | | | |
|---|---|---|---|
| 2009/0090929 A1 | 4/2009 | Tu et al. | |
| 2010/0258822 A1* | 10/2010 | Kobayashi | H01L 25/0753 257/88 |
| 2010/0258824 A1* | 10/2010 | Wang | H01L 33/38 257/91 |
| 2010/0276706 A1 | 11/2010 | Herrmann | |
| 2012/0164767 A1* | 6/2012 | Gasse | H01L 27/153 438/27 |
| 2012/0326171 A1* | 12/2012 | Lee | H01L 33/38 257/88 |
| 2014/0159071 A1* | 6/2014 | Choi | H01L 27/15 257/88 |

FOREIGN PATENT DOCUMENTS

| | | |
|---|---|---|
| EP | 0 070 234 A2 | 1/1983 |
| EP | 2 960 940 A1 | 12/2015 |

* cited by examiner

DEVICE COMPRISING A PLURALITY OF DIODES

This application claims the priority benefit of French patent application number 17/51239, the content of which is hereby incorporated by reference in its entirety to the maximum extent allowable by law.

BACKGROUND

The present disclosure generally relates to the field of semiconductor diodes. According to a first aspect, it aims at a device comprising a plurality of diodes. According to a second aspect, it aims at improving the injection of the electric power supply current into a diode. The examples detailed hereafter in relation with the drawings essentially relate to the field of gallium nitride light-emitting diodes, in which field the described embodiments are particularly advantageous. The present disclosure is however not limited to this specific field of application.

DISCUSSION OF THE RELATED ART

Figure 1:
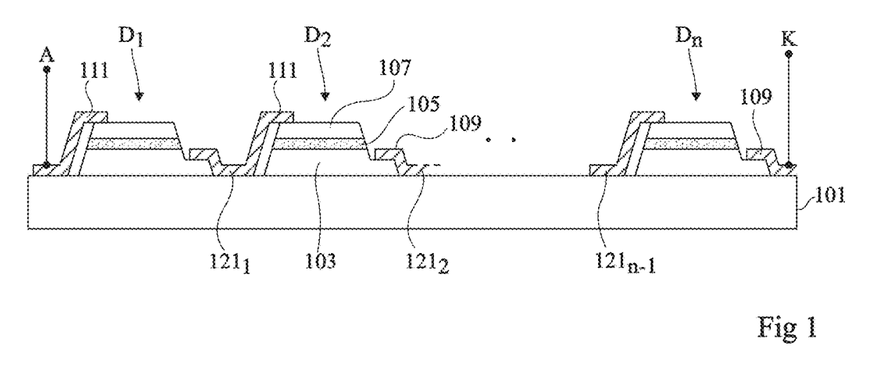
FIG. 1, previously described, is a cross-section view schematically showing an example of a device comprising a plurality of series-connected diodes.

FIG. 1 is a cross-section view schematically showing an example of a device comprising a plurality of series-connected gallium nitride light-emitting diodes $D_1, D_2, \ldots, D_n$, where n is an integer greater than 1. Such a series association of light-emitting diodes is particularly adapted to lighting applications, where the serializing of the diodes enables to power the device under a relatively high voltage, while having a high light emitting efficiency.

The device of FIG. 1 comprises a sapphire support substrate 101, having diodes $D_1, D_2, \ldots, D_n$ arranged thereon. Each diode $D_i$ (i being in the range from 1 to n) comprises an active region comprising a vertical stack comprising, in the following order from the upper surface of substrate 101, an N-type doped gallium nitride layer 103, an emissive layer 105, and a P-type doped gallium nitride layer 107. Layer 107 defines the anode region of the diode, and layer 103 defines the cathode region of the diode. Emissive layer 105 is for example formed by a vertical stack of a plurality of layers, each forming a quantum well.

The active region of each diode $D_i$ forms a pad or island which is not adjacent to an active region of another diode $D_j$. Diodes $D_1, D_2, \ldots, D_n$ are substantially identical, to within manufacturing dispersions. In particular, diodes $D_1, D_2, \ldots, D_n$, have, in top view (not shown), substantially the same general shape, for example, a square or rectangular shape.

Each diode $D_i$ has, on the side of a lateral edge of its active region, a cathode contacting region where anode layer 107 and emissive layer 105 are interrupted to enable to take an electric contact on the upper surface of cathode layer 103. A cathode contact metallization 109 is arranged on top of and in contact with the upper surface of cathode layer 103 at the level of the cathode contacting region.

Each diode $D_i$ further comprises an anode contacting region located on the side of a lateral edge of its region opposite to the cathode contacting region. An anode contact metallization 111 is arranged on top of and in contact with the upper surface of anode layer 107 at the level of the anode contacting region.

In the example of FIG. 1, diodes $D_1, D_2, \ldots, D_n$ are arranged in a row by order of increasing index or rank i, each diode $D_i$, except for diode $D_n$, having its cathode contacting region facing the anode contacting region of the diode of higher index $D_{i+1}$. Interconnection metallizations $121_1, 121_2, \ldots, 121_{n-1}$ connect diodes $D_1, D_2, \ldots, D_n$ in series. More particularly, for each diode $D_i$ except for diode $D_n$, an interconnection metallization $121_i$, connecting cathode contact metallization 109 of diode $D_i$ to anode contact metallization 111 of diode $D_{i+1}$, is provided. Anode contact metallization 111 of diode $D_1$ is connected to a positive power supply terminal A or anode contact terminal of the device, and cathode contact metallization 109 of diode $D_n$ is connected to a negative power supply terminal K or cathode contact terminal of the device.

Figure 2:
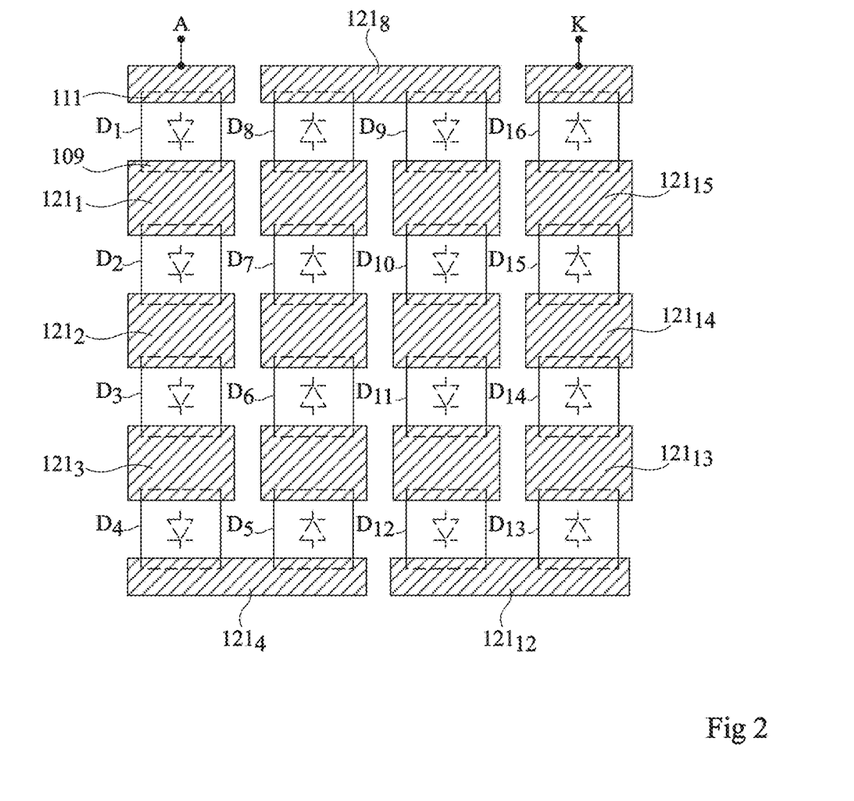
FIG. 2, previously described, is a cross-section view schematically showing another example of a device comprising a plurality of series-connected diodes.

FIG. 2 is a top view schematically showing a variation of the device of FIG. 1. In the example of FIG. 2, the device comprises n=16 diodes $D_1, D_2, \ldots, D_{16}$. In FIG. 2, diodes $D_1, D_2, \ldots, D_{16}$ have been schematically represented by squares, which corresponds to the general shape of their active region in top view.

The device of FIG. 2 differs from the device of FIG. 1 in that, in the device of FIG. 2, diodes $D_1, D_2, \ldots D_n$ are arranged, rather than in a row, in an array of a plurality of rows and a plurality of columns (4 rows and 4 columns in the shown example). In each column of the array, the column diodes are series-connected. The diodes of a same column are oriented along a same anode-to-cathode direction, the diodes of adjacent columns being oriented along opposite anode-to-cathode directions. In each column except for the first and last columns of the array, the anode and cathode ends of the series association of the diodes of the column are respectively connected to the cathode end of the series association of the diodes of the previous column, and to the anode end of the series association of the diodes of the next column, so that the n diodes $D_1, D_2, \ldots, D_n$ are all series-connected. The anode end of the series association of the diodes of the first column is connected to terminal A of the device, and the cathode end of the series association of the diodes of the last column is connected to terminal K of the device.

A disadvantage of devices of the type described in relation with FIGS. 1 and 2 is that the length of the contact regions between two consecutive diodes of the series association of diodes $D_1, D_2, \ldots, D_n$ is limited to the length of an edge of the active region of a diode. The connection resistance being inversely proportional to the length of the interconnected contact regions, the general series resistance of the device is thereby relatively high.

Further, a disadvantage of devices with an array layout of the type described in relation with FIG. 2 is that there may exist strong potential differences between two neighboring diodes of the array, particularly at the non-interconnected ends of adjacent columns of the array. For example, neighboring diodes $D_1$ and $D_8$, respectively $D_5$ and $D_{12}$, respectively $D_9$ and $D_{16}$ of the device of FIG. 2 have, in operation, their anode and cathode regions biased to relatively distant potentials. This imposes specific relatively constraining precautions in terms of insulation.

Further, a problem which is posed in the field of semiconductor diodes and in particular in the field of light-emitting diodes is the problem of injection of the electric power supply current into the active region of the diode. This problem is particularly posed in the field of gallium nitride diodes, due to the relatively high electric resistivity of the N-type doped gallium nitride forming the cathode region of the diode. In the article entitled "High performance GaN-based flip-chip LEDs with different electrode patterns" of Ray-Hua Horng et al., cathode metallization patterns enabling to relatively homogeneously distribute the current in the cathode region of the diode have already been provided. It would however be desirable to further improve the performance of injection of electric current into a diode.

SUMMARY

Thus, an embodiment provides a device comprising a plurality of interconnected concentric coplanar diodes.

According to an embodiment, each diode comprises a continuous active region comprising a vertical stack of first and second regions of opposite conductivity types, the active regions of the different diodes being separated from one another by ring-shaped trenches crossing said stack.

According to an embodiment, the diodes are series-connected.

According to an embodiment, two neighboring diodes are connected by a metallization arranged in the ring-shaped trench which separates them and extending along substantially the entire length of said trench.

According to an embodiment, the diodes are connected two by two in antiparallel, the associations of two diodes in antiparallel being series-connected.

According to an embodiment:

first and second neighboring diodes are connected by first and second metallizations arranged in the ring-shaped trench which separates them, and substantially extending along respective first and second halves of the length of said trench; and a third diode next to the second diode is connected to the second diode by a metallization arranged in the ring-shaped trench which separates them, and extending along substantially the entire length of the trench.

According to an embodiment, each diode comprises an electrode for biasing its first region arranged in a trench extending from the surface of the second region opposite to the first region, the electrode comprising, in top view, the following conductive elements:

a polygonal ring;

for each vertex of the polygonal ring, a first rectilinear bar extending between the vertex and the center of the ring, substantially along a direction running from the vertex to the center of the ring; and for each first bar, a plurality of second rectilinear bars extending from the first bar substantially parallel to the sides of the ring starting from the vertex forming the origin of the first bar.

According to an embodiment, in each diode, the dimensions of the first and second bars are such that the volume of the second region located, in top view, within the ring, is continuous.

According to an embodiment, the diodes are light-emitting diodes.

According to an embodiment, the diodes are gallium nitride diodes.

Another embodiment provides a diode comprising a vertical stack of first and second semiconductor regions having opposite conductivity types, and a first electrode for biasing its first region arranged in a trench extending from the surface of the second region opposite to the first region, the first electrode comprising, in top view, the following conductive elements:

a polygonal ring;

for each vertex of the polygonal ring, a first rectilinear bar extending between the vertex and the center of the ring, substantially along a direction running from the vertex to the center of the ring; and for each first bar, a plurality of second rectilinear bars extending from the first bar substantially parallel to the sides of the ring, starting from the vertex forming the origin of the first bar.

According to an embodiment, the dimensions of the first and second bars are such that the volume of the second region located, in top view, within the ring, is continuous.

According to an embodiment, for each first bar, the first electrode comprises one or a plurality of pairs of second bars extending from the first bar, and, in each pair of second bars, the bars of the pair extend from a same point of the first bar.

According to an embodiment, in each pair of second bars:

a first bar of the pair extends substantially parallel to a first side of the ring connected to the vertex forming the origin of the first bar having the second bars of the pair extending therefrom, in a direction opposite to a second side of the ring connected to said vertex; and a second bar of the pair extends substantially parallel to the second side of the ring connected to the vertex forming the origin of the first bar having the bars of the pair extending therefrom, in a direction opposite to the first side of the ring connected to said vertex.

According to an embodiment, for each first bar, the pairs of second bars connected to the first bar are regularly distributed along the first bar.

According to an embodiment, each second bar is interrupted before it reaches a straight line connecting the center of the ring to the middle of the side of the ring parallel to the second bar and connected to the vertex forming the origin of the first bar having the second bar extending therefrom.

According to an embodiment, the diode further comprises a second electrode for biasing its second region arranged on the surface of the second region opposite to the first region.

According to an embodiment, the second electrode has, in top view, the shape of a ring contained within the polygonal ring of the first electrode.

According to an embodiment, the ring of the second electrode is interrupted at the level of each of the intersections with the first bars of the first electrode so as not to pass above said first bars.

According to an embodiment, the ring of the second electrode is continuous, and the first bars of the first electrode are interrupted at the intersections with the ring of the second electrode so as not to pass under said ring.

According to an embodiment, the polygonal ring of the first electrode is separated in two separate portions each extending along substantially half the length of the diode periphery.

The foregoing and other features and advantages will be discussed in detail in the following non-limiting description of specific embodiments in connection with the accompanying drawings, among which:

DETAILED DESCRIPTION

The same elements have been designated with the same reference numerals in the various drawings and, further, the various drawings are not to scale. For clarity, only those steps and elements which are useful to the understanding of the described embodiments have been shown and are detailed. In particular, the control circuits which may be used to control the described devices have not been detailed, the described embodiments being compatible with usual semiconductor diode control circuits. In the following description, when reference is made to terms qualifying absolute positions, such as terms "front", "rear", "top", "bottom", "left", "right", etc., or relative positions, such as terms "above", "under", "upper", "lower", etc., or to terms qualifying directions, such as terms "horizontal", "vertical", etc., it is referred to the orientation of the cross-section views of the drawings, it being understood that, in practice, the described devices may have different orientations. Unless otherwise specified, expressions "approximately", "substantially", and "in the order of" mean to within 10%, preferably to within 5%, or when they relate to angular values or to orientations, to within 10 degrees, preferably to within 5 degrees.

First Aspect (Device Comprising a Plurality of Diodes)

Figure 3A:
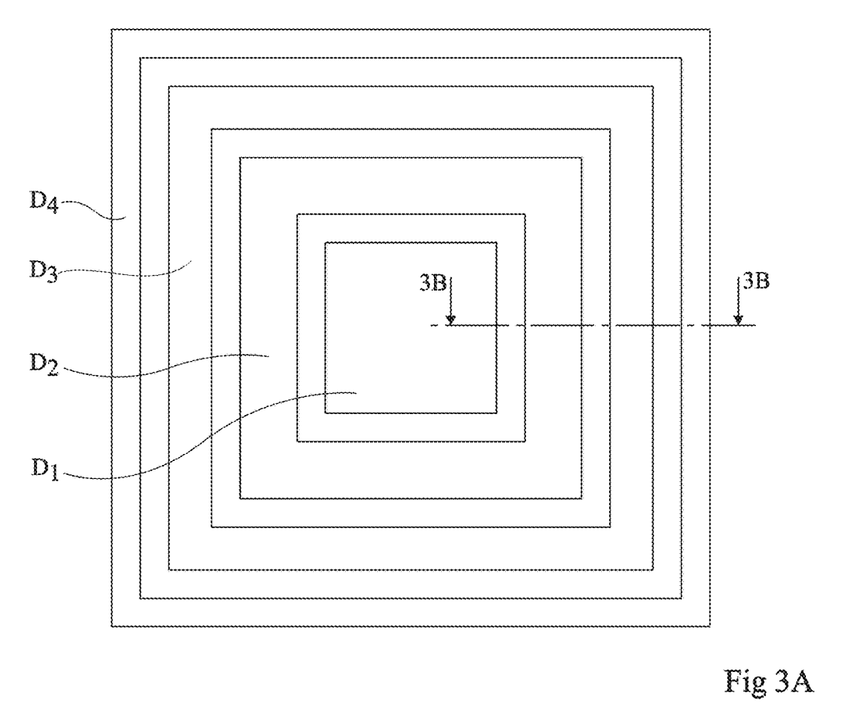
FIGS. 3A and 3B are respectively a top view and a cross-section view schematically showing an example of a device comprising a plurality of diodes according to an embodiment.
Figure 3B:
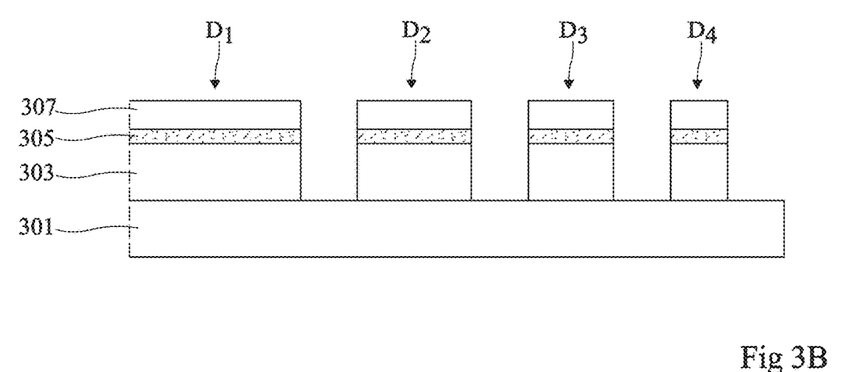

FIGS. 3A and 3B schematically show an embodiment of a device comprising a plurality of gallium nitride light-emitting diodes. FIG. 3A is a top view of the device and FIG. 3B is a partial cross-section view of the device along plane 3B-3B of FIG. 3A.

The device of FIGS. 3A and 3B comprises four light-emitting gallium nitride diodes $D_1$, $D_2$, $D_3$, $D_4$. More generally, the embodiments described in relation with FIGS. 3A, 3B, 4, 5A, 5B, 6, 7A, and 7B apply whatever number n of diodes $D_1$, $D_2$, ..., $D_n$ of the device, n being an integer greater than 1.

The device of FIGS. 3A and 3B comprises a sapphire support substrate 301 (FIG. 3B), having diodes $D_1$, $D_2$, ..., $D_n$ arranged on its upper surface. Substrate 301 is for example made of sapphire or of any other adapted material. Substrate 301 is for example transparent.

Each diode $D_i$, i being in the range from 1 to n, comprises an active region comprising a vertical stack comprising, in the following order from the upper surface of substrate 301, an N-type doped gallium nitride layer 303, an emissive layer 305, and a P-type doped gallium nitride layer 307. Layer 307 defines the anode region of the diode, and layer 303 defines the cathode region of the diode. Emissive layer 305 is for example formed by a vertical stack of one or a plurality of layers, each forming a quantum well, for example, based on GaN, InN, InGaN, AlGaN, AlN, AlInGaN, GaP, AlGaP, AlInGaP, or on a combination of one or a plurality of these materials. As a variation, emissive layer 305 may be an intrinsic gallium nitride layer, that is, it is not intentionally doped. In this example, the lower surface of emissive layer 305 is in contact with the upper surface of cathode layer 303, and the upper surface of emissive layer 305 is in contact with the lower surface of anode layer 307. In practice, according to the nature of substrate 301, a stack of one or a plurality of buffer layers (not shown) may form an interface between support substrate 301 and gallium nitride layer 303.

The active region of each diode $D_i$ is not adjacent to an active region of another diode $D_j$ of the device. In other words, the active regions of the different diodes $D_i$ are separated from one another by trenches thoroughly crossing the stack formed by active layers 303, 305, and 307 of the device, which particularly enables to interconnect diodes of the device in series. The active layers 303, 305, and 307 of each diode $D_i$ are however continuous layers.

For clarity, the anode and cathode contact metallizations of the diodes and the possible diode insulation and interconnection elements have not been shown in FIGS. 3A and 3B.

According to an aspect of an embodiment, diodes $D_1$, $D_2$, ..., $D_n$ of the device of FIGS. 3A and 3B are coplanar and concentric.

Coplanar here means that, rather than being are not stacked on one another, diodes $D_1$, $D_2$, ..., $D_n$ are arranged in a same mean plane parallel to the upper surface of support substrate 301. In other words, the distance between support substrate 301 and the PN junction or the emissive layer of each diode $D_i$, is substantially the same for all diodes $D_1$, $D_2$, ..., $D_n$ of the device.

Further, concentric here means that, except for a diode $D_j$ which will be called central diode (diode $D_1$ in the example of FIGS. 3A and 3B), the active region of which may have any shape, the active regions of the other diodes $D_i$ have, in top view, the shape of nested rings surrounding the active region of the central diode. As an example, the active regions of diodes $D_1$, $D_2$, ..., $D_n$ have, in top view, a same center of symmetry. In the shown example, in top view, the outer dimensions of diodes $D_1$, $D_2$, ... $D_n$ increase according to the index or rank i of the diode. In other words, except for central diode $D_1$, each diode $D_i$ totally surrounds the diode having the immediately lower index $D_{i-1}$. Further, except for diode $D_n$, each diode $D_i$ is totally surrounded by the diode having the immediately higher index $D_{i+1}$. In the shown example, in top view, the active region of central diode $D_1$ has a generally square shape, and the active region of each other diode $D_i$ has a square ring shape with substantially the same center as the active region of diode $D_1$. As a variation, diodes $D_1$, $D_2$, ... $D_n$ may have, in top view, rectangular, circular, elliptic shapes, or any other non-necessarily symmetrical shape, for example, triangular shapes.

Preferably, diodes $D_1$, $D_2$, ..., $D_n$ are sized to all have substantially the same active region surface area.

As an example, the distances separating consecutive diodes of the device two by two are all substantially identical.

Figure 4:
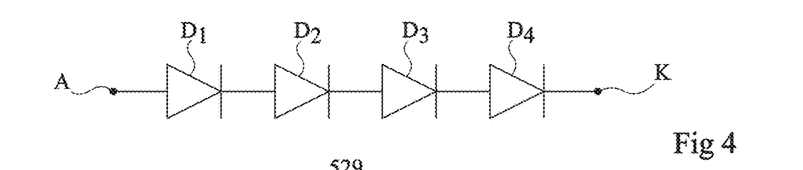
FIG. 4 is an electric diagram of an example of a device comprising a plurality of interconnected diodes.

FIG. 4 is an electric diagram of an example of a device comprising n interconnected diodes $D_1$, $D_2$, ... $D_n$ (n=4 in the shown example).

In the example of FIG. 4, diodes $D_1$, $D_2$, ..., $D_n$ are series-connected between a positive power supply terminal A or anode contact terminal of the device, and a negative power supply terminal K or cathode contact terminal of the device. More particularly, each $D_i$ except for diode $D_n$ has its cathode connected to the anode of the diode having the immediately higher index $D_{i+i}$, the anode of diode $D_1$ being connected to terminal A and the cathode of diode $D_n$ being connected to terminal K.

Figure 5A:
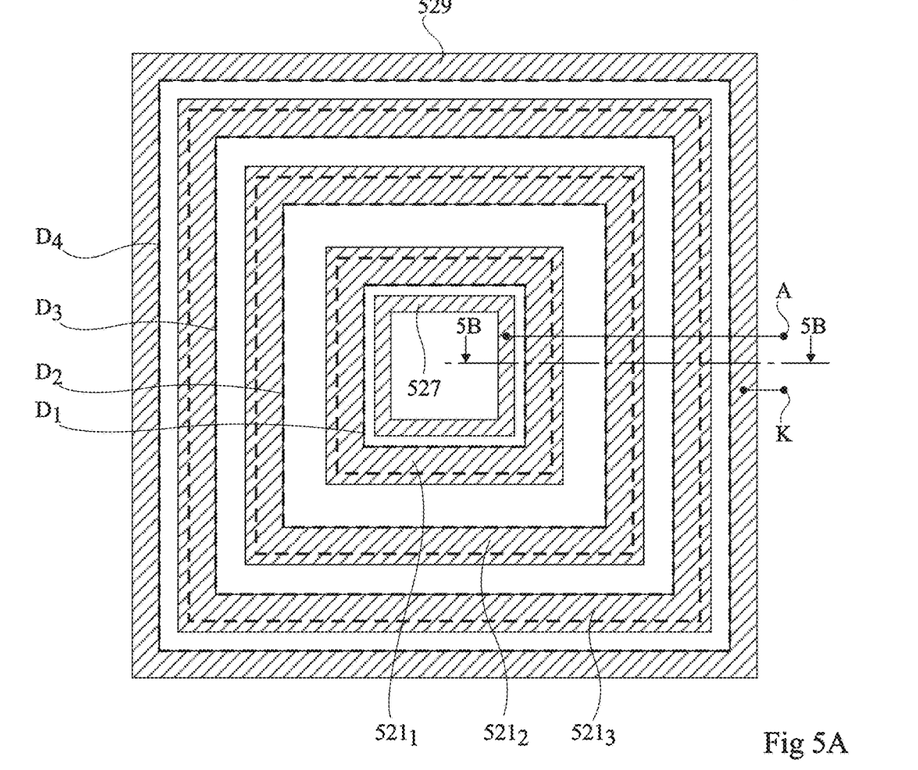
FIGS. 5A and 5B are respectively a top view and a cross-section view illustrating an embodiment of the device of FIG. 4.
Figure 5B:
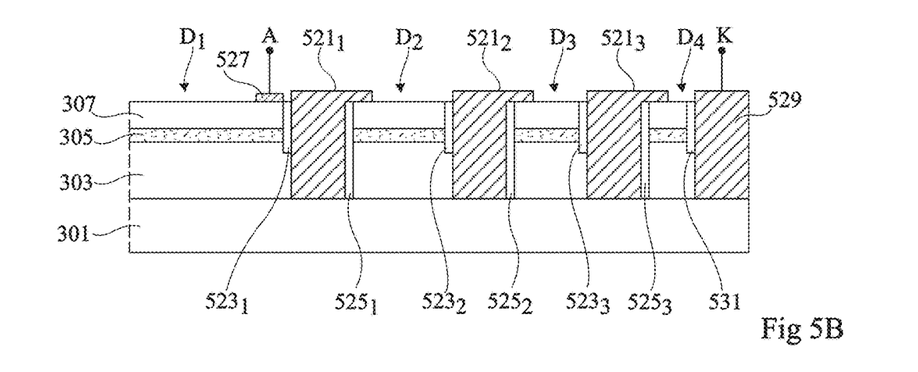

FIGS. 5A and 5B illustrate an example of connection of concentric diodes $D_1, D_2, \ldots, D_n$ of the device of FIGS. 3A and 3B according to the electric diagram of FIG. 4. FIGS. 5A and 5B are views along the same orientations as FIGS. 3A and 3B More particularly, FIG. 5A is a top view of the device, and FIG. 5B is a partial cross-section view of the device along plane 5B-5B of FIG. 5A. The common elements between FIGS. 3A, 3B, and FIGS. 5A, 5B will not be detailed again. For a better readability, in the top view of FIG. 5A, the active regions of $D_1, D_2, \ldots, D_n$ have been schematically shown by dashed lines delimiting their contours.

The device of FIGS. 5A and 5B comprises interconnection metallizations $521_1, 521_2, \ldots, 521_{n-1}$ connecting diodes $D_1, D_2, \ldots, D_n$ in series. More particularly, for each diode $D_i$ except for diode $D_n$, an interconnection metallization $521_i$ is provided, connecting the cathode region 303 of diode $D_i$ to the anode region 307 of diode $D_{i+1}$. Each metallization $521_i$ coats the lateral walls and the bottom of the peripheral trench or ring-shaped trench separating diode $D_i$ from diode $D_{i+1}$. In the shown example, each metallization $521_i$ totally fills the peripheral trench separating diode $D_i$ from diode $D_{i+1}$. Metallization $521_i$ is in contact with the outer side of cathode region 303 of diode $D_i$ along substantially the entire length of the peripheral trench separating diode $D_i$ from diode $D_{i+1}$. The outer sides of layers 305 and 307 of diode $D_i$ are coated with an insulating layer $523_i$, particularly insulating the anode region 307 of diode $D_i$ from metallization $521_i$. Further, the inner sides of layers 303, 305, and 307 of diode $D_{i+1}$ are coated with an insulating layer $525_i$, particularly insulating the cathode region 303 of diode $D_{i+1}$ from metallization $521_i$. For simplification, insulating regions $523_i$ and $525_i$ have not been detailed in FIG. 5A. Each metallization $521_i$ further extends above a peripheral strip of anode region 307 of diode $D_{i+1}$ located on the inner side of diode $D_{i+i}$. This extension of metallization $521_i$ is in contact with the upper surface of anode region 307 of diode $D_{i+1}$ along substantially the entire length of the peripheral trench separating diodes $D_i$ and $D_{i+1}$. Thus, each metallization $521_i$ substantially connects the entire outer periphery of the cathode region of diode $D_i$ to substantially the entire inner periphery of the anode region of diode $D_{i+1}$.

The device of FIGS. 5A and 5B further comprises an anode contact metallization 527 arranged in contact with anode region 307 of diode $D_1$. In this example, metallization 527 is arranged on top of and in contact with the upper surface of anode region 307 of diode $D_1$. More particularly, in the shown example, metallization 527 has, in top view, a ring shape extending above a peripheral strip of anode region 307 of diode $D_1$.

The device of FIGS. 5A and 5B further comprises a cathode contact metallization 529 arranged in contact with cathode region 303 of diode $D_n$. In this example, metallization 529 is arranged on top of and in contact with the outer side of cathode region 303 of diode $D_n$. More particularly, in the shown example, metallization 529 is in contact with the outer side of diode $D_n$ along substantially the entire length of the outer periphery of diode $D_n$. The outer sides of layers 305 and 307 of diode $D_n$ are coated with an insulating layer 531, particularly insulating anode region 307 of diode $D_n$ from metallization 529.

Anode contact metallization 527 of diode $D_1$ is connected to positive terminal A of the device, and cathode contact metallization 529 of diode $D_n$ is connected to negative terminal K of the device.

As compared with the devices of FIGS. 1 and 2, an advantage of the device described in relation with FIGS. 5A and 5B is that the length of the contact regions between two consecutive diodes $D_i$ and $D_{i+1}$ of the series association of diodes $D_1, D_2, \ldots, D_n$ extends along substantially the entire length of the outer contour of diode $D_i$. This enables to significantly decrease the general series resistance of the device.

Further, as compared with the device of FIG. 2, an advantage of the device described in relation with FIGS. 5A and 5B is that the maximum potential difference between two adjacent diodes of the device is limited to the voltage drop of a diode, which enables to release the diode insulation constraints.

Figure 6:
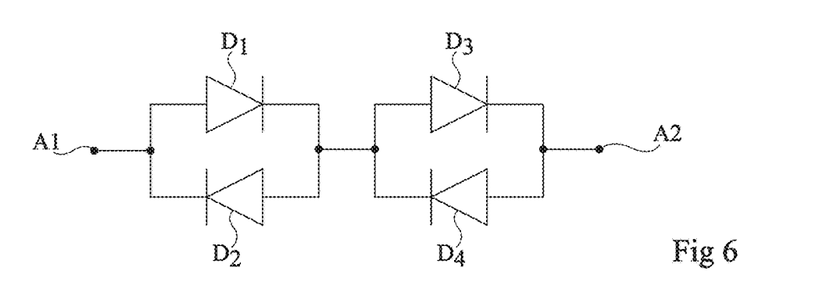
FIG. 6 is an electric diagram of another example of a device comprising a plurality of interconnected diodes.

FIG. 6 is an electric diagram of another example of a device comprising n interconnected diodes $D_1, D_2, \ldots D_n$, where n is an even number (n=4 in the shown example).

In the example of FIG. 6, diodes $D_1, D_2, \ldots, D_n$ are connected two by two in antiparallel, the associations of two diodes in antiparallel being series-connected between power supply terminals A1 and A2 of the device. In the shown example, each diode of odd index $D_i$ is connected in antiparallel with the diode $D_{i+1}$ of immediately higher even index, that is, its anode is connected to the cathode of diode $D_{i+1}$ and its cathode is connected to the anode of diode $D_{i+1}$. The associations of two diodes in antiparallel are series-connected between terminals A1 and A2 of the device. More particularly, each association of two diodes $D_i$ and $D_{i+1}$ in antiparallel (where i is the index of odd rank of the association), except for the association of diodes $D_{n-1}$ and $D_n$, has its common node between the cathode of diode $D_i$ and the anode of diode $D_{i+1}$ connected to the common node between the anode of diode $D_{i+2}$ and the cathode of diode $D_{i+3}$ of the next association. The common node between the anode of diode $D_1$ and the cathode of diode $D_2$ is connected to terminal A1 of the device, and the common node between the cathode of diode $D_{n-1}$ and the anode of diode $D_n$ is connected to terminal A2 of the device.

Such a series/antiparallel association of diodes is particularly adapted to lighting applications, where such a diode interconnection scheme enables to supply the device by means of an AC voltage applied between terminals A1 and A2. During positive halfwaves of the voltage applied between terminals A1 and A2, only the diodes of odd rank are conductive and emit light, while the diodes of even rank are blocked and off. During negative halfwaves, the diodes of even rank take over and emit light, while the diodes of odd rank are blocked and off.

Figure 7A:
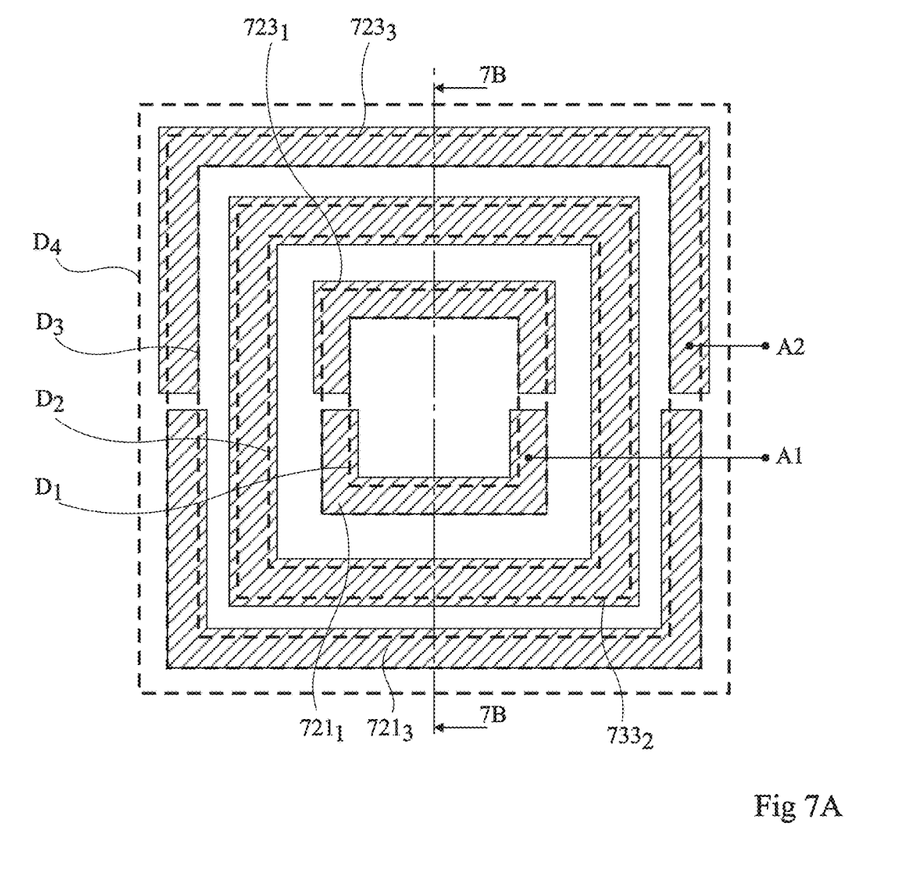
FIGS. 7A and 7B are respectively a top view and a cross-section view illustrating an embodiment of the device of FIG. 6.
Figure 7B:
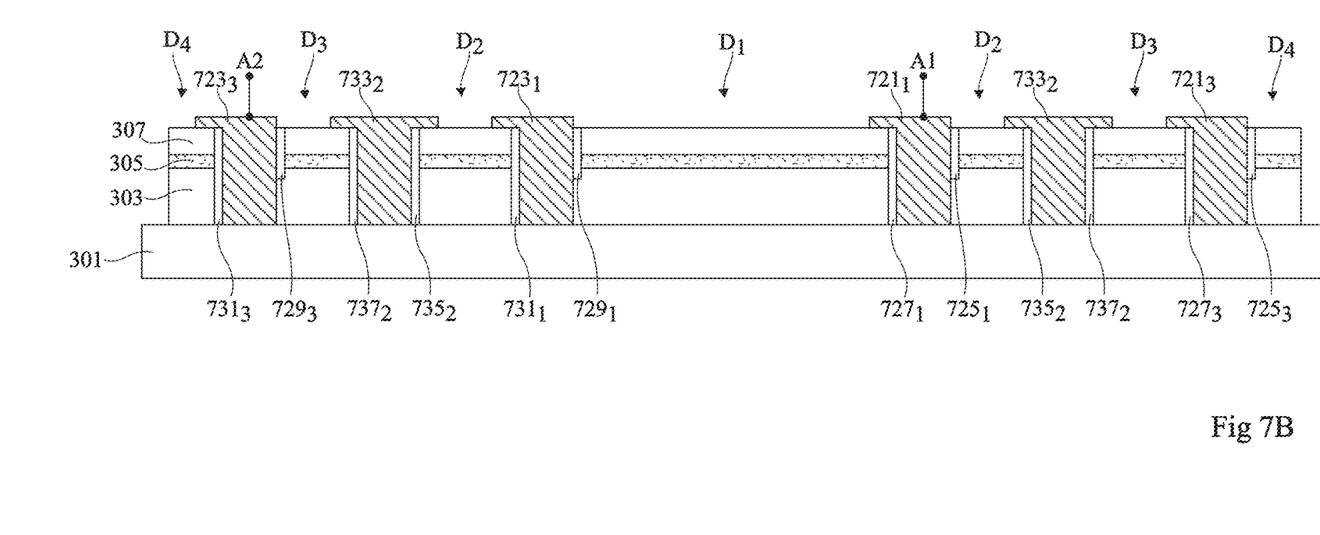

FIGS. 7A and 7B illustrate an example of connection of concentric diodes $D_1, D_2, \ldots, D_n$ of the device of FIGS. 3A and 3B according to the electric diagram of FIG. 6. FIG. 7A is a top view of the device, and FIG. 7B is a cross-section view of the device along plane 7B-7B of FIG. 7A. The common elements between FIGS. 3A, 3B, and FIGS. 7A, 7B will not be detailed again. In the top view of FIG. 7A, the active regions of $D_1, D_2, \ldots, D_n$ have been schematically shown by dashed lines delimiting their contours.

The device of FIGS. 7A and 7B comprises, for each diode $D_i$ of odd rank, a first interconnection metallization $721_i$ connecting the anode region 307 of diode $D_i$ to the cathode region 303 of diode $D_{i+1}$, and a second interconnection metallization $723_i$ insulated from first metallization $721_i$, connecting the cathode region 303 of diode $D_i$ to the anode region 307 of diode $D_{i+1}$.

In top view, each metallization $721_i$ continuously extends along a first half of the peripheral trench separating diodes $D_i$ and $D_{i+1}$, and each metallization $723_i$ continuously extending along the second half of the peripheral trench separating diodes $D_i$ and $D_{i+1}$.

Each metallization $721_i$ coats the lateral walls and the bottom of the first half of the peripheral trench separating diodes $D_i$ and $D_{i+1}$, and extends above a peripheral region of anode region 307 of diode $D_i$ located on the side of the outer edge of diode $D_i$, along said first half of the peripheral trench separating diodes $D_i$ and $D_{i+1}$. In the shown example, metallization $721_i$ totally fills the first half of the peripheral trench separating diode $D_i$ from diode $D_{i+1}$. Metallization $721_i$ is in contact with the inner edge of cathode region 303 of diode $D_{i+1}$ along substantially the entire length of the first half of the peripheral trench diodes separating diodes $D_i$ and $D_{i+1}$. The inner sides of layers 305 and 307 of diode $D_{i+1}$ are coated with an insulating layer $725_i$, particularly insulating the anode region 307 of diode $D_{i+1}$ from metallization $721_i$ along substantially the entire length of the first half of the peripheral trench separating diodes $D_i$ and $D_{i+1}$. Further, the outer sides of layers 303, 305, and 307 of diode $D_i$ are coated with an insulating layer $727_i$, insulating the cathode region 303 of diode $D_i$ from metallization $721_i$. Metallization $721_i$ is further in contact with the upper surface of the anode region 307 of diode $D_i$ over substantially the entire length of the first half of the peripheral trench separating diodes $D_i$ and $D_{i+1}$. Thus, each metallization $721_i$ substantially connects the entire first half of the outer periphery of the anode region of diode $D_i$ to substantially the entire first half of the inner periphery of the cathode region of diode $D_{i+1}$.

Each metallization $723_i$ coats the lateral walls and the bottom of the second half of the peripheral trench separating diodes $D_i$ and $D_{i+1}$ and extending above a peripheral strip of the anode region 307 of diode $D_{i+1}$ located on the side of the inner edge of diode $D_{i+1}$, along said second half of the peripheral trench separating diodes $D_i$ and $D_{i+1}$. In the shown example, metallization $723_i$ totally fills the second half of the peripheral trench separating diode $D_i$ from diode $D_{i+1}$. Metallization $723_i$ is in contact with the outer side of cathode region 303 of diode $D_i$ along substantially the entire length of the second half of the peripheral trench separating diodes $D_i$ and $D_{i+1}$. The outer sides of layers 305 and 307 of diode $D_i$ are coated with an insulating layer $729_i$, particularly insulating anode region 307 of diode $D_i$ from metallization $723_i$ along substantially the entire length of the second half of the peripheral trench separating diodes $D_i$ and $D_{i+1}$. Further, the inner sides of layers 303, 305, and 307 of diode $D_{i+1}$ are coated with an insulating layer $731_i$, particularly insulating cathode region 303 of diode $D_{i+1}$ from metallization $723_i$, along substantially the entire length of the second half of the peripheral trench separating diodes $D_i$ and $D_{i+1}$. Metallization $723_i$ is further in contact with the upper surface of the anode region 307 of diode $D_{i+1}$ along substantially the entire length of the second half of the peripheral trench separating diodes $D_i$ and $D_{i+1}$. Thus, each metallization $723_i$ substantially connects the entire second half of the outer periphery of the cathode region of diode $D_i$ to substantially the entire second half of the outer periphery of the anode region of diode $D_{i+1}$.

The device of FIGS. 7A and 7B comprises, for each diode $D_i$ of even rank except for diode $D_n$, an interconnection metallization $733_i$ connecting the anode region 307 of diode $D_i$ to the anode region 307 of diode $D_{i+1}$.

In top view, each metallization $733_i$ continuously extends along substantially the entire length of the peripheral trench separating diodes $D_i$ and $D_{i+1}$.

Each metallization $733_i$ coats the lateral walls and the bottom of the peripheral trench separating diodes $D_i$ and $D_{i+1}$. In the shown example, each metallization $733_i$ totally fills the peripheral trench separating diode $D_i$ from diode $D_{i+1}$. The outer sides of layers 303, 305, and 307 of diode $D_i$ are coated with an insulating layer $735_i$, particularly insulating cathode region 303 of diode $D_i$ from metallization $733_i$ along the entire length of the peripheral trench separating diodes $D_i$ and $D_{i+1}$. Further, the inner sides of layers 303, 305, and 307 of diode $D_{i+1}$ are coated with an insulating layer $737_i$, particularly insulating cathode region 303 of diode $D_{i+1}$ from metallization $733_i$ along the entire length of the peripheral trench separating diodes $D_i$ and $D_{i+1}$. Each metallization $733_i$ further extends, along the entire length of the peripheral trench separating diodes $D_i$ and $D_{i+1}$, above a peripheral strip of the anode region 307 of ring-shaped diode $D_{i+1}$ located on the side of the inner edge of diode $D_{i+1}$. This extension of metallization $733_i$ is in contact with the upper surface of the anode region 307 of diode $D_{i+1}$ along the entire length of the peripheral trench separating diodes $D_i$ and $D_{i+1}$. Each metallization $733_i$ further extends, along the entire length of the peripheral trench separating diodes $D_i$ and $D_{i+1}$, above a peripheral strip of the anode region 307 of the ring-shaped diode $D_i$ located on the outer side of diode $D_i$. Such an extension of metallization $733_i$ is further in contact with the upper surface of the anode region 307 of diode $D_i$ over substantially the entire length of the peripheral trench separating diodes $D_i$ and $D_{i+1}$. Thus, each metallization $733_i$ substantially connects the entire outer periphery of the anode region of diode $D_i$ to substantially the entire inner periphery of the cathode region of diode $D_{i+1}$.

Metallization $721_1$ connecting the anode of diode $D_1$ to the cathode of diode $D_2$ is connected to terminal A1 of the device, and metallization $723_{n-1}$ connecting the cathode of diode $D_{n-1}$ to the anode of diode $D_n$ is connected to terminal A2 of the device.

The device of FIGS. 7A and 7B has substantially the same advantages as the device of FIGS. 5A and 5B in terms of general series resistance of the device and in terms of maximum potential difference between two neighboring diodes of the device.

Second Aspect (Diode with an Improved Electric Current Injection)

Figure 8A:
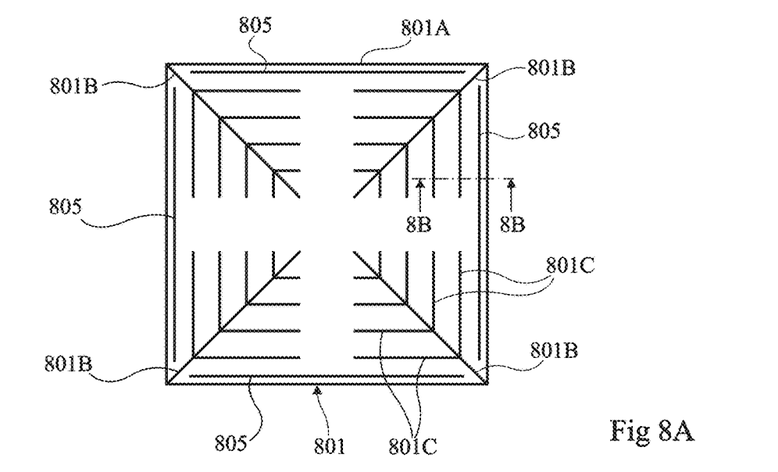
FIGS. 8A and 8B respectively are a top view and a simplified cross-section view schematically illustrating an embodiment of a semiconductor diode.
Figure 8B:
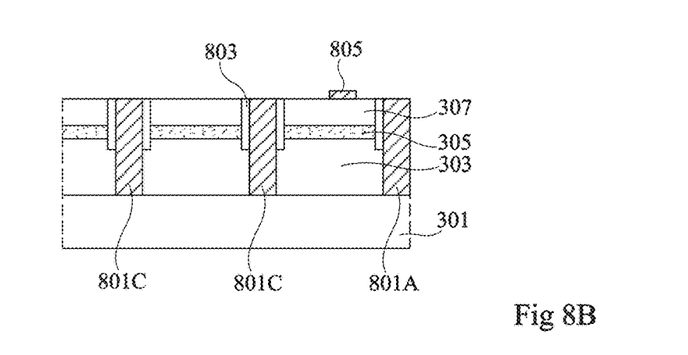

FIGS. 8A and 8B schematically illustrate an embodiment of a semiconductor diode. FIG. 8A is a top view of the diode and FIG. 8B is a partial cross-section view along plane 8B-8B of FIG. 8A.

As in the previous examples, the diode of FIGS. 8A and 8B is a gallium nitride light-emitting diode arranged on a support substrate 301, for example, made of sapphire, and having its active region comprising a vertical stack comprising, in the following order from the upper surface of substrate 301, an N-type doped gallium nitride layer 303, defining the cathode region of the diode, an emissive layer 305, and a P-type doped gallium nitride diode 307, defining the cathode region of the diode.

The diode of FIGS. 8A and 8B comprises an electrode 801 for biasing its cathode region 303, arranged in a trench extending from the upper surface of anode region 307 and totally crossing anode layer 307. Electrode 801 is in contact with the sides of cathode layer 303 inside of the trench. The sides of layers 305 and 307 are coated with an insulating layer 803, particularly enabling to insulate anode region 307 of the diode from electrode 801. In the shown example, electrode 801 totally fills the trench where it is arranged.

In top view, the conductive pattern of cathode electrode 801 comprises the following elements:
- a polygonal ring 801A;
- for each vertex of polygonal ring 801A, a rectilinear bar 801B extending from the vertex of the ring substantially towards the center of the ring, bar 801B being interrupted before the center of the ring; and
- for each bar 801B, a plurality of rectilinear bars 801C extending from bar 801B substantially parallel to the sides of the ring connected to the vertex forming the origin of bar 801B.

Term center of the polygonal ring here designates the center of gravity of the ring, which may be a center of symmetry in the case of a symmetrical ring, for example, in the case of a regular polygon.

As an example, polygonal ring 801A surrounds, in top view, the active region of the diode.

For each bar 801B, electrode 801 comprises one or a plurality of pairs of bars 801C, for example, regularly distributed between the two ends of bar 801B. In each pair of bars 801C, the first and second bars 801C in the pair start from a same point of bar 801B and respectively extend on either side of bar 801B. More particularly, the first bar 801C of the pair extends parallel to a first side of the ring connected to the vertex forming the origin of bar 801B, in a direction opposite to the second side of the ring connected to said vertex, and the second bar 801C of the pair extends parallel to the second side of the ring connected to said vertex, in a direction opposite to the first side of the ring connected to said vertex.

The layout and the sizing of bars 801B and 801C is selected so that the volume of the anode region 307 of the diode located, in top view, within ring 801A is continuous. In particular, in the shown example, each bar 801C is interrupted before it reaches the line connecting the center of the ring to the middle of the side of the ring parallel to bar 801C and connected to the vertex forming the origin of bar 801B having bar 801C extending therefrom.

The continuity of anode region 307 enables to bias the latter by means of a single electrode, for example located in the vicinity of the periphery of the diode.

In the shown example, the diode comprises an electrode 805 for biasing its anode region 307, arranged on top of and in contact with the upper surface of anode region 307. In this example, electrode 805 has, in top view, the shape of a polygonal ring substantially having the same shape as ring 801A but smaller dimensions, contained within ring 801A. In this example, ring 805 is open at the level of each of its vertices so as not to pass above bars 801B of cathode electrode 801.

Figure 9:
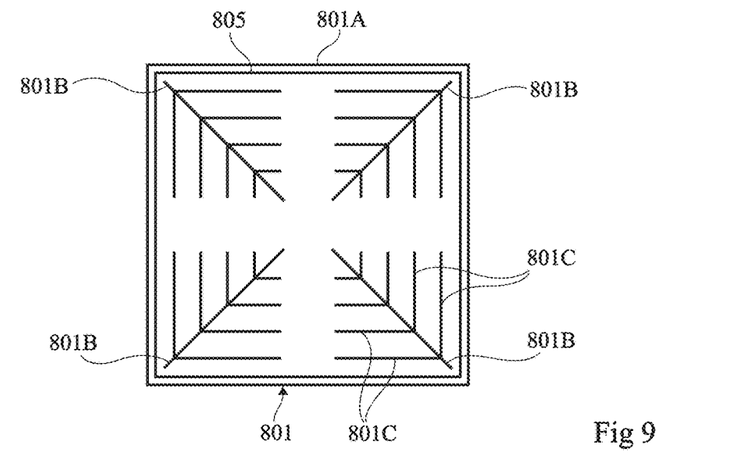
FIG. 9 is a top view schematically illustrating an alternative embodiment of the diode of FIGS. 8A and 8B.

FIG. 9 illustrates an alternative embodiment where ring 805 of the anode electrode is continuous, and where bars 801B of cathode electrode 801 are interrupted at the intersections with ring 805 so as not to pass under ring 805.

The cathode electrode layout described in the example of FIGS. 8A and 8B and in the variation of FIG. 9 has the advantage of allowing a good distribution of the current in the cathode region of the diode. Such an electrode layout thus improves the electric current injection into the diode, which enables to increase the light emitting efficiency of the diode as compared with known cathode electrode layouts.

In the case of a structure with concentric diodes of the type described in relation with FIGS. 3A, 3B, 4, 5A, 5B, 6, 7A, 7B, such an electrode layout may be provided in the central diode $D_1$ of the device.

In particular, the layout described in relation with FIG. 8A, 8B, or 9 may be used as such for diode $D_1$ of the device of FIGS. 5A and 5B (series assembly).

Figure 10:
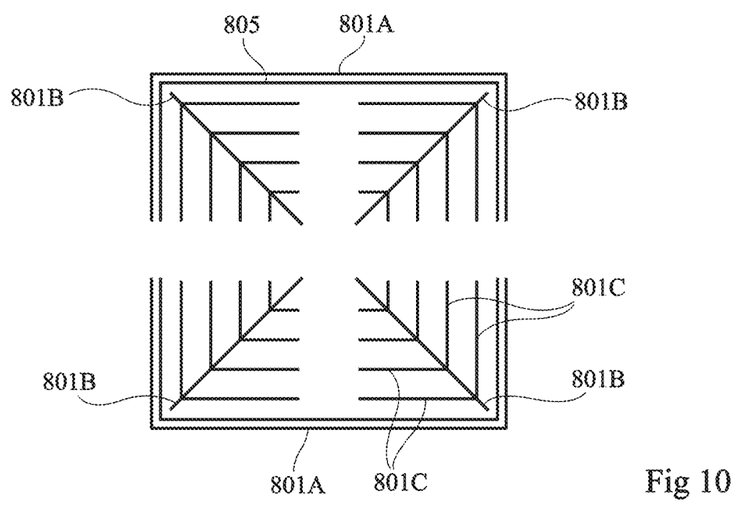
FIG. 10 is a top view schematically illustrating another alternative embodiment of the diode of FIGS. 8A and 8B.

FIG. 10 illustrates an example of layout of the electrodes of diode $D_1$ capable of being used in the device of FIGS. 7A and 7B (series/antiparallel assembly). The main difference with respect to the examples of FIGS. 8A, 8B, and 9 is that the polygonal ring 801A of cathode electrode 801 is separated in two separate portions, each extending along substantially half the length of the outer periphery of the diode. Further, cathode electrode 805 is reduced to a half-ring extending along substantially half the length of the outer periphery of the diode.

In the shown example, half-ring 805 is continuous and the bars 801B located on the path of half-ring 805 are interrupted so as not to pass under electrode 805 (similarly to what has been described in relation with FIG. 9). As a variation, half-ring 805 may be interrupted at the level of each its vertices so as not to pass above bars 801B of electrode 801 (similarly to what has been described in relation with FIGS. 8A and 8B).

In the case of a structure with concentric diodes of the type described in relation with FIGS. 3A, 3B, 4, 5A, 5B, 6, 7A, 7B, an electrode layout similar to what has been described in relation with FIGS. 8A, 8B, 9, and 10 may be provided in each of the ring-shaped diodes having a rank higher than 1 of the device.

Manufacturing Method (Example)

FIGS. 11A, 11B, 11C, 11D, 11E, 11F are cross-section views schematically and partially illustrating an embodiment of a method of manufacturing devices of the above-described type. FIGS. 11A, 11B, 11C, 11D, 11E, 11F more particularly detail the forming of three types of characteristic contact metallizations which may be present in the above-described devices, that is:

I) a metallization connecting the cathode region 303 of a diode to the anode region 307 of a neighboring diode, for example corresponding to metallizations $521_i$ of FIGS. 5A and 5B or to metallizations $721_i$ or $723_i$ of FIGS. 7A and 7B;

II) a current conduction metallization in the cathode region of a diode, for example corresponding to bars 801B or 801C of FIG. 8A, 8B, 9, or 10; and III) a metallization connecting the anode regions of two neighboring diodes, for example corresponding to metallizations $733_i$ of FIGS. 7A and 7B.

Figure 11A:
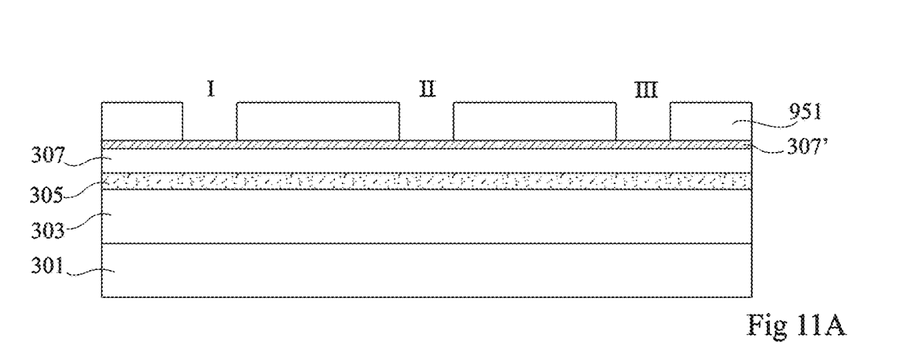
FIGS. 11A, 11B, 11C, 11D, 11E, 11F are cross-section views schematically and partially illustrating an embodiment of a method of manufacturing a device comprising one or a plurality of semiconductor diodes.

FIG. 11A illustrates an initial stack comprising support substrate 301, and, in the following order from the upper surface of substrate 301, an N-type doped gallium nitride layer 303, an emissive layer 305, and a P-type doped gallium nitride layer 307. In the example of FIG. 11A, the initial stack further comprises, on top of and in contact with the upper surface of P-type doped gallium nitride layer 307, a metal layer 307'. Metal layer 307' forms an ohmic contact with the upper surface of anode layer 307. Layer 307' is for example a single layer, or a stack of a plurality of separate metal layers. The surface of layer 307' facing layer 307 is for example reflective, which enables, in the case of a device intended to emit light on the lower surface side of substrate 301, to reflect towards substrate 301 the light emitted by the diode towards its surface opposite to substrate 301, and thus to increase the light emitting efficiency of the device. As an example, layer 307' is a layer made of silver, aluminum, or of a silver-aluminum alloy. Layer 307', although not shown in the previous drawings, may be provided in all the embodiments described in relation with FIGS. 3A, 3B, 4, 5A, 5B,

6, 7A, 7B, 8A, 8B, 9, 10, substantially coating the entire upper surface of the anode region 307 of the diodes.

FIG. 11A illustrates a step of deposition, on the upper surface of the initial stack, that is, on the upper surface of layer 307', in this example, of a masking layer 951, for example, made of silicon oxide.

FIG. 11A further illustrates a step of forming through openings in masking layer 951, for example, by lithography and etching, opposite the areas where the type-I), -II), and -III) metallizations are desired to be formed.

Figure 11B:
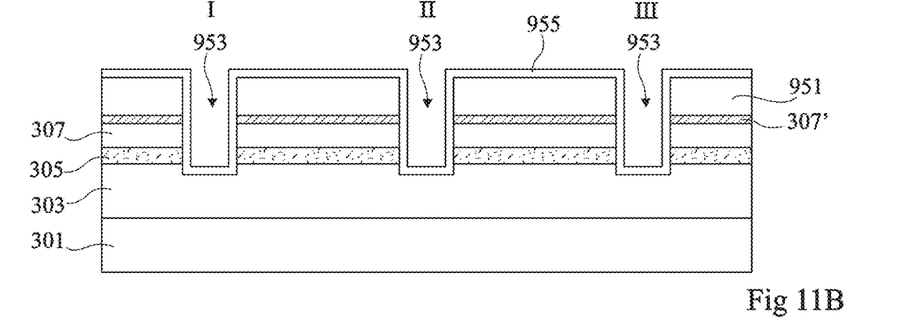

FIG. 11B illustrates a subsequent step of etching of trenches 953 crossing metal layer 307', layers 307 and 305, and a portion of the thickness of layer 303, opposite the openings previously formed in layer 951, by using layer 951 as an etch mask.

FIG. 11B further illustrates a subsequent step of conformal deposition of an insulating layer 955, for example, by silicon oxide, over the entire upper surface of the structure, and in particular over the lateral walls and over the bottom of trenches 953.

Figure 11C:
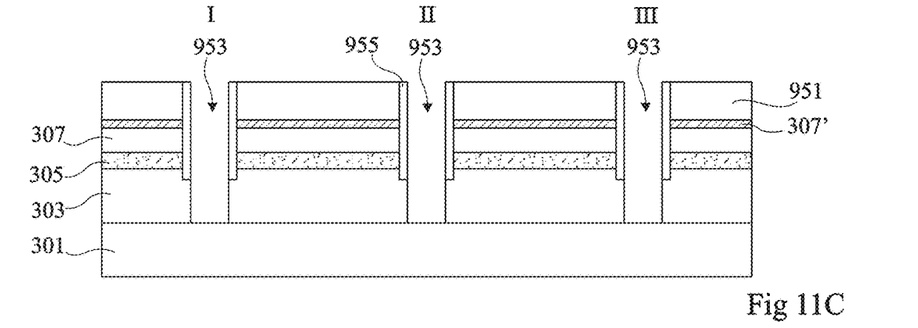

FIG. 11C illustrates a subsequent step of anisotropic etching of insulating layer 955, during which the portions of layer 955 coating the bottom of trenches 953 are removed, to free the access to the upper surface of layer 303 at the bottom of trenches 953, without removing the portions of layer 955 coating the lateral walls of trenches 953.

FIG. 11C further illustrates a subsequent step of etching of the lower portion of layer 303 opposite the openings of mask 951, to extend trenches 953 down to the upper surface of substrate 301.

Figure 11D:
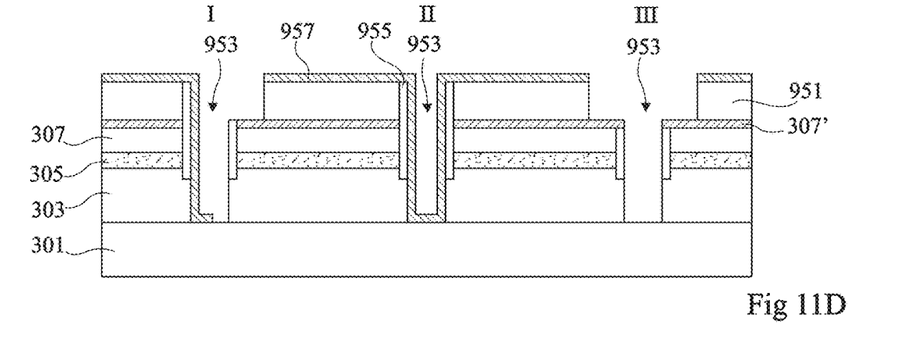

FIG. 11D illustrates a subsequent step of conformal deposition of a metal layer 957 intended to form an ohmic contact with the sides of N-type gallium nitride layer 303. Layer 957 is first deposited over substantially the entire upper surface of the structure, and particularly over the lateral walls and over the bottom of trenches 953.

At the level of the type-I metallizations (cathode-to-anode connection), metal layer 957 is then locally removed from the side of one of the two diodes separated by trench 953 (that with an anode which should be connected to the cathode of the other diode).

Further, at the level of the type-III metallizations (anode-to-cathode connection), metal layer 957 is locally removed from the sides of the two diodes separated by trench 953.

The local removal of layer 957 is for example performed by lithography and etching (non-detailed steps).

FIG. 11D further illustrates a step of local etching of masking layer 951, to extend the openings of mask 951 opposite the anode connection regions of the type-I and -III metallizations, to free the access to the upper surface of metal layer 307' in these regions.

Figure 11E:
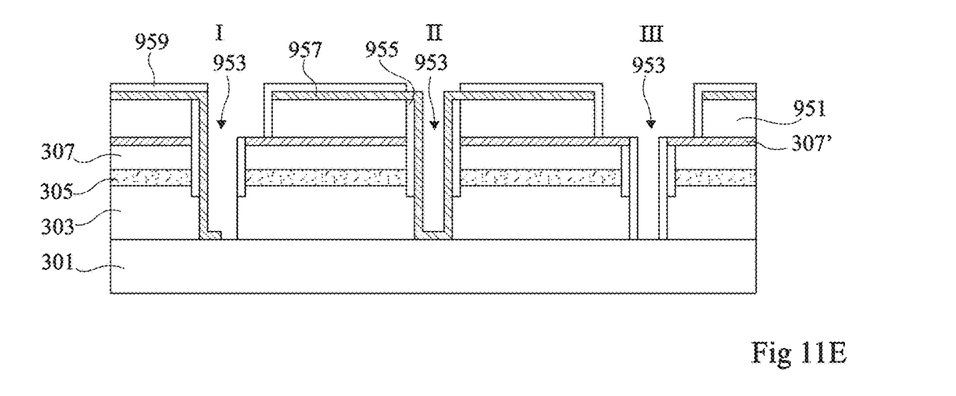

FIG. 11E illustrates a subsequent step of conformal deposition of an insulating layer 959 over substantially the entire upper surface of the structure. Layer 959 is then locally removed from the portions of metal layer 957 located in trenches 953, at the level of the type-I and -II metallizations. Insulating layer 959 is further locally removed from above the anode connection regions of the type-I and -III metallizations.

Figure 11F:
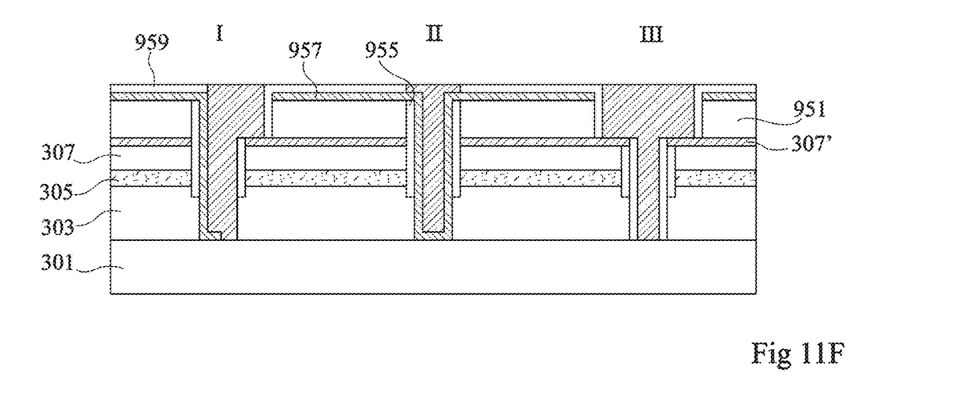

FIG. 11F illustrates a subsequent step of filling of trenches 953 with a conductive material, for example, copper, to form the desired type-I, -II, and -III metallizations.

Specific embodiments have been described. Various alterations, modifications, and improvements will occur to those skilled in the art. In particular, although only embodiments relating to gallium nitride light-emitting diodes have been described, the described embodiments are not limited to this specific case. As a variation, the described embodiments may be adapted to light-emitting diodes using other semiconductor materials than gallium nitride, for example, silicon diodes, or also to light-receiving diodes, or also to diodes with no optical function, for example, power diodes. It should in particular be noted that in the case of light-receiving diodes, the cathode electrode patterns described in relation with FIGS. 8A, 8B, 9, and 10 enable to improve the collection of the photogenerated charges.

Further, although only embodiments where the contact on the cathode regions of the diodes is taken on the lateral walls of trenches thoroughly crossing the active diode stack have been described, the described embodiments are not limited to this specific case. In particular, the first and second above-described aspects may be adapted to diodes of the type described in relation with FIG. 1, where the contact on the cathode regions of the diodes is taken on the upper surface of regions from which the anode layer has been locally removed. Further, the first above-described aspect may be adapted to so-called vertical injection diodes (as opposed to lateral injection diodes of the type described in the present description), where the contact on the cathode regions of the diodes is taken from the lower surface of the cathode region.

Further, in the described embodiments, the P (anode) and N (cathode) conductivity types of semiconductor regions 307 and 303 may be inverted.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A device comprising a plurality of interconnected concentric coplanar diodes, each diode comprising a continuous active region comprising a vertical stack of first and second regions of opposite conductivity types, the active regions of the different diodes being separated from one another by ring-shaped trenches crossing said stack,
wherein the diodes are series-connected, first and second neighboring diodes being connected by a metallization arranged in the ring-shaped trench which separates them, said metallization extending along substantially the entire length of the trench and being in contact with the first region of the first diode and with the second region of the second diode along substantially the entire length of the trench, said metallization being in contact with the first region of the first diode only via the sides of the first region of the first diode.

2. The device of claim 1, wherein said metallization is in contact with the side of the first region of the first diode and with the upper surface of the second region of the second diode along substantially the entire length of the trench.

3. The device of claim 1, wherein each diode comprises an electrode for biasing its first region arranged in a trench extending from the surface of the second region opposite to the first region, said electrode comprising, in top view, the following conductive elements:
a polygonal ring;
for each vertex of the polygonal ring, a first rectilinear bar extending between the vertex and the center of the ring, substantially along a direction running from the vertex to the center of the ring; and for each first bar, a plurality of second rectilinear bars extending from the first bar substantially parallel to the sides of the ring, starting from the vertex forming the origin of the first bar.

4. The device of claim 3, wherein, in each diode, the dimensions of the first and second bars are such that the volume of the second region located, in top view, within the ring, is continuous.

5. The device of claim 1, wherein the diodes are light-emitting diodes.

6. The device of claim 1, wherein the diodes are gallium nitride diodes.

* * * * *